(12) United States Patent
Cheng et al.

(10) Patent No.: US 10,950,711 B2
(45) Date of Patent: Mar. 16, 2021

(54) FABRICATION OF VERTICAL FIELD EFFECT TRANSISTOR STRUCTURE WITH STRAINED CHANNELS

(71) Applicant: INTERNATIONAL BUSINESS MACHINES CORPORATION, Armonk, NY (US)

(72) Inventors: Kangguo Cheng, Schenectady, NY (US); Juntao Li, Cohoes, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/690,799

(22) Filed: Nov. 21, 2019

(65) Prior Publication Data

US 2020/0091318 A1    Mar. 19, 2020

Related U.S. Application Data

(60) Division of application No. 15/628,102, filed on Jun. 20, 2017, now Pat. No. 10,586,858, which is a
(Continued)

(51) Int. Cl.
*H01L 29/66* (2006.01)
*H01L 29/78* (2006.01)
(Continued)

(52) U.S. Cl.
CPC .............. *H01L 29/66666* (2013.01); *H01L 21/823487* (2013.01); *H01L 27/088* (2013.01);
(Continued)

(58) Field of Classification Search
CPC ....... H01L 29/66666; H01L 21/823487; H01L 27/088; H01L 29/0657; H01L 29/42392;
(Continued)

(56) References Cited

U.S. PATENT DOCUMENTS 6,531,377 B2    3/2003 Knorr et al.
6,897,527 B2    5/2005 Dakshina-Murthy et al.
(Continued)

OTHER PUBLICATIONS

List of IBM Patents or Patent Applications Treated as Related dated Nov. 21, 2019, 2 pages.
(Continued)

*Primary Examiner* — Dzung Tran
(74) *Attorney, Agent, or Firm* — Tutunjian & Bitetto, P.C.; Randall Bluestone

(57) ABSTRACT

A method of forming a vertical fin field effect transistor (vertical finFET) with a strained channel, including forming one or more vertical fins on a substrate, forming a sacrificial stressor layer adjacent to the one or more vertical fins, wherein the sacrificial stressor layer imparts a strain in the adjacent vertical fins, forming a fin trench through one or more vertical fins and the sacrificial stressor layer to form a plurality of fin segments and a plurality of sacrificial stressor layer blocks, forming an anchor wall adjacent to and in contact with one or more fin segment endwalls, and removing at least one of the plurality of the sacrificial stressor layer blocks, wherein the anchor wall maintains the strain of the adjacent fin segments after removal of the sacrificial stressor layer blocks adjacent to the fin segment with the adjacent anchor wall.

20 Claims, 8 Drawing Sheets

Related U.S. Application Data continuation of application No. 15/152,080, filed on May 11, 2016, now Pat. No. 9,755,073.

(51) Int. Cl.
| | |
|---|---|
| *H01L 29/786* | (2006.01) |
| *H01L 27/088* | (2006.01) |
| *H01L 21/8234* | (2006.01) |
| *H01L 29/06* | (2006.01) |
| *H01L 29/423* | (2006.01) |

(52) U.S. Cl.
CPC .... *H01L 29/0657* (2013.01); *H01L 29/42392* (2013.01); *H01L 29/6653* (2013.01); *H01L 29/66742* (2013.01); *H01L 29/66772* (2013.01); *H01L 29/7827* (2013.01); *H01L 29/7843* (2013.01); *H01L 29/7847* (2013.01); *H01L 29/78618* (2013.01); *H01L 29/78642* (2013.01); *H01L 29/78654* (2013.01); *H01L 29/78696* (2013.01); *H01L 29/7851* (2013.01)

(58) Field of Classification Search
CPC .......... H01L 29/6653; H01L 29/66742; H01L 29/66772; H01L 29/7827; H01L 29/7843; H01L 29/7847; H01L 29/78618; H01L 29/78642; H01L 29/78654; H01L 29/78696; H01L 29/7851
USPC ........................................................ 257/329
See application file for complete search history.

(56) References Cited

U.S. PATENT DOCUMENTS

| | | |
|---|---|---|
| 6,974,981 B2 | 12/2005 | Chidambarrao et al. |
| 7,384,830 B2 | 6/2008 | Cohen |
| 7,586,130 B2 | 9/2009 | Kawashima et al. |
| 7,767,565 B2 | 8/2010 | Chung |
| 8,637,849 B2 | 1/2014 | Deligianni et al. |
| 8,673,718 B2 | 3/2014 | Maszara et al. |
| 9,793,403 B2 | 10/2017 | Obradovic et al. |
| 2003/0001290 A1 | 1/2003 | Nitayama et al. |
| 2006/0113522 A1 | 6/2006 | Lee et al. |
| 2006/0125044 A1 | 6/2006 | Haller |
| 2006/0258084 A1 | 11/2006 | Tang et al. |
| 2006/0273370 A1 | 12/2006 | Forbes |
| 2007/0018206 A1 | 1/2007 | Forbes |
| 2007/0108514 A1 | 5/2007 | Inoue et al. |
| 2007/0228437 A1 | 10/2007 | Forbes |
| 2009/0261380 A1 | 10/2009 | Anderson et al. |
| 2009/0325350 A1 | 12/2009 | Radosavljevic et al. |
| 2014/0008736 A1 | 1/2014 | Li et al. |
| 2015/0001591 A1* | 1/2015 | Akarvardar ....... H01L 21/02236 257/288 |
| 2015/0179454 A1 | 6/2015 | Lee et al. |
| 2015/0333078 A1 | 11/2015 | Colinge et al. |
| 2015/0349069 A1 | 12/2015 | Xie et al. |

OTHER PUBLICATIONS

Office Action dated Jan. 29, 2018 from co-pending U.S. Appl. No. 15/392,815 (pp. 1-19).

List of IBM Patents or Patent Applications Treated as Related dated Jun. 20, 2017, 2 pages.

Belyansky, et al., Methods of Producing Plasma Enhanced Chemical Vapor Deposition Silicon Nitride Thin Films With High Compressive and Tensile Stress, J. Vac. Sci. Technol, May/Jun. 2008, pp. 517-521.

Chen et al., Vertical Nanowire Transistors with Low Leakage Current, Applied Physics Letters, Aug. 2004, pp. 1401*-1403, vol. 85, No. 8.

Office Action dated Apr. 1, 2020 for U.S. Appl. No. 16/114,899, 16 pages.

Office Action dated Feb. 12, 2020 for U.S. Appl. No. 16/264,757, 10 pages.

\* cited by examiner

FABRICATION OF VERTICAL FIELD EFFECT TRANSISTOR STRUCTURE WITH STRAINED CHANNELS

BACKGROUND

Technical Field

The present invention relates to fabricating a vertical field effect transistor (VFET) structure with a strained channel, and more particularly to controlling a strain in a channel material for a VFET by utilizing a sacrificial stressor material and a stressor anchor material to impose a channel material strain.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and finFETs have been formed with the channel extending outward from the substrate, but where the current also flows horizontally from a source to a drain. The channel for the finFET can be an upright slab of thin rectangular Si, commonly referred to as the fin with a gate on the fin, as compared to a MOSFET with a single gate in the plane of the substrate. Depending on the doping of the source and drain, an n-FET or a p-FET may be formed.

Examples of FETs can include a metal-oxide-semiconductor field effect transistor (MOSFET) and an insulated-gate field-effect transistor (IGFET). Two FETs also may be coupled to form a complementary metal oxide semiconductor (CMOS), where a p-channel MOSFET and n-channel MOSFET are coupled together.

With ever decreasing device dimensions, forming the individual components and electrical contacts become more difficult. An approach is therefore needed that retains the positive aspects of traditional FET structures, while overcoming the scaling issues created by forming smaller device components.

SUMMARY

A method of forming a vertical fin field effect transistor (vertical finFET) with a strained channel, including forming one or more vertical fins on a substrate, forming a sacrificial stressor layer adjacent to the one or more vertical fins, wherein the sacrificial stressor layer imparts a strain in the adjacent vertical fins, forming a fin trench through one or more vertical fins and the sacrificial stressor layer to form a plurality of fin segments and a plurality of sacrificial stressor layer blocks, forming an anchor wall adjacent to and in contact with one or more fin segment endwalls, and removing at least one of the plurality of the sacrificial stressor layer blocks, wherein the anchor wall maintains the strain of the adjacent fin segments after removal of the sacrificial stressor layer blocks adjacent to the fin segment with the adjacent anchor wall.

A method of forming a vertical finFET with a strained channel, including forming a plurality of vertical fins on a substrate, forming a sacrificial stressor layer adjacent to the vertical fins, wherein the sacrificial stressor layer is in contact with the sidewalls of the adjacent vertical fins, and imparts a strain to the adjacent vertical fins, forming a plurality of fin trenches through the plurality of vertical fins and the sacrificial stressor layer, where the fin trench separates the vertical fins into columns of fin segments and a plurality of sacrificial stressor layer blocks adjacent to two fin segments, forming an anchor wall in each fin trench adjacent to and in contact with one or more fin segment endwalls, and removing the plurality of the sacrificial stressor layer blocks, wherein the anchor wall maintains the strain of the adjacent fin segments after removal of the sacrificial stressor layer blocks adjacent to the fin segment with the adjacent anchor wall.

A vertical fin field effect transistor (finFET), including one or more vertical fins formed on a substrate, a doped region in the substrate located below at least one of the one or more vertical fins, an anchor wall at each end of the one or more vertical fins, where the anchor wall is in contact with the endwall of the vertical fin, and where the anchor wall maintains the vertical fin in a strained state, a bottom spacer on the substrate and adjacent the sidewall of at least one of the one or more vertical fins, a gate structure on at least a portion of the sidewalls of at least one of the one or more vertical fins, and a top spacer on the gate structure opposite the bottom spacer.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
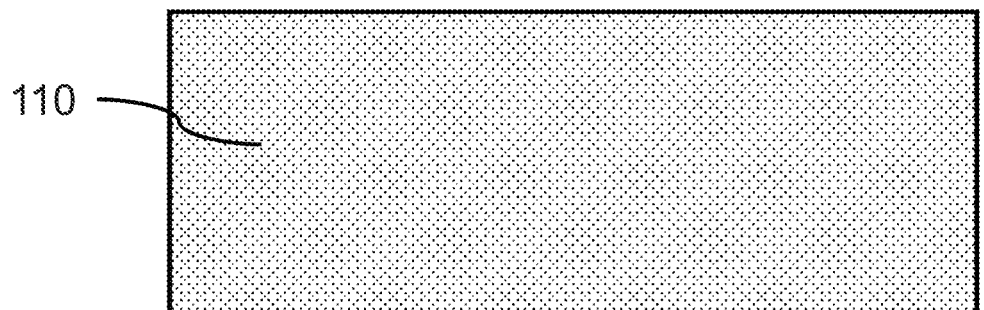
FIG. 1 is a cross-sectional side view of a substrate in accordance with an exemplary embodiment.

Principles and embodiments of the present disclosure relate generally to an approach to fabricate a vertical field effect transistor (VFET), or more specifically a vertical fin field effect transistor (vertical finFET), where current flows vertically through the channel, including creating and maintaining the VFET channel in a strained state. A material with different properties, such as different coefficients of thermal expansion (CTE) and/or different lattice constants may be used to impart a strain in the vertical fin, and/or a second material may be used to anchor the vertical fin in the strained state. A vertical compressive or tensile stress may be applied to the vertical fin by an adjacent material.

Principles and embodiments also relate to forming one or more vertical fin field effect transistor (vertical finFETs) with a vertical channel structure having an increased carrier mobility and/or increased drive current in the channel(s) of the one or more vertical finFETs due to an imparted strain. In one or more embodiments, a sacrificial stressor material may be formed adjacent to one or more vertical fins, where the difference between the coefficient of thermal expansion of the sacrificial stressor material and the coefficient of thermal expansion of the vertical fin material can determine the amount of strain induced in the vertical fin(s). An anchor wall may be formed in contact with an end face of the one or more vertical fins to maintain the fins in a strained state after removal of the sacrificial stressor material due to an internal stress.

It has been found that maintaining a strain in a vertical fin can be very difficult due to various relaxation mechanisms available to a vertical fin due to the fin alignment and geometry. A vertical fin may become relaxed regardless of its initial strain status because unlike a typical MOSFET a vertical fin typically is free-standing and not in contact with a material (e.g., substrate) that consistently applies or maintains a stress. An approach to maintaining a strain in a vertical fin can involve having opposing vertical surfaces of the vertical fin in contact with a material that physically keeps the fin in a strained state without interfering with other features of the semiconductor device.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein s for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper", and the like, may be used herein for ease of description to describe one element's or feature's relationship to another element(s) or feature(s) as illustrated in the FIGs. It will be understood that the spatially relative terms are intended to encompass different orientations of the device use or operation in addition to the orientation depicted in the FIGs. For example, if the device in the FIGs. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

While exemplary embodiments have been shown for a particular device, it should be understood that a plurality of such devices may be arranged and/or fabricated on a substrate to form integrated devices that may be integrated onto a substrate, for example through very large scale integration to produce complex devices such a central processing units (CPUs) and application specific integrated circuits (ASICs). The present embodiments may be part of a device or circuit, and the circuits as described herein may be part of a design for an integrated circuit chip.

Referring now to the drawings in which like numerals represent the same or similar elements and initially to FIG. 1, which is a cross-sectional side view of a substrate in accordance with an exemplary embodiment.

In one or more embodiments, a substrate 110 may be a semiconductor or an insulator with an active surface semiconductor layer. The substrate may be crystalline, semi-crystalline, microcrystalline, or amorphous. The substrate may be essentially (i.e., except for contaminants) a single element (e.g., silicon), primarily (i.e., with doping) of a single element, for example, silicon (Si) or germanium (Ge), or the substrate may include a compound, for example, $Al_2O_3$, $SiO_2$, GaAs, SiC, or SiGe. The substrate may also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate may also have other layers forming the substrate, including high-k oxides and/or nitrides. In one or more embodiments, the substrate 110 may be a silicon wafer. In an embodiment, the substrate may be a single crystal silicon (Si), silicon germanium (SiGe), or III-V semiconductor (e.g., GaAs) wafer, or have a single crystal silicon (Si), silicon germanium (SiGe), or III-V semiconductor (e.g., GaAs) surface/active layer.

Figure 2:
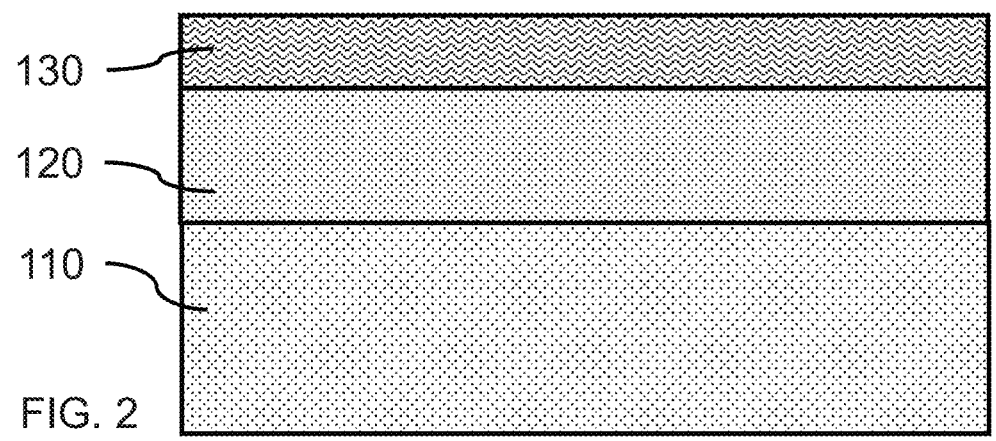
FIG. 2 is a cross-sectional side view of a substrate with a hardmask layer and a photo mask layer in accordance with an exemplary embodiment.

FIG. 2 is a cross-sectional side view of a substrate with a hardmask layer and a photo mask layer in accordance with an exemplary embodiment.

In one or more embodiments, a hardmask layer 120 may be formed on an exposed surface of the substrate 110. A photo mask layer 130 may be formed on the exposed surface of the hardmask layer 120. In various embodiments, the hardmask layer may be an oxide, for example, silicon oxide (SiO), a nitride, for example, a silicon nitride (SiN), or an oxynitride, for example, silicon oxynitride (SiON), or combinations thereof. In various embodiments, the hardmask layer 120 may be silicon nitride (SiN), for example, $Si_3N_4$. The hard mask layer may also be formed by a thermal process, such as, for example, oxidation or nitridation of the top semiconductor layer. A combination of the various processes may also be used to form hardmask layer 120.

In various embodiments, a photo mask layer 130 may be a temporary resist (e.g., PMMA) that may be deposited on the hardmask layer 120, patterned, and developed to expose portions of the hardmask layer 120. The photo mask layer 130 may be a positive resist or a negative resist.

In various embodiments, the hardmask layer 120 may have a thickness in the range of about 20 nm to about 80 nm, or in the range of about 30 nm to about 60 nm, or in the range of about 40 nm to about 50 nm, although other thicknesses are contemplated.

Figure 3:
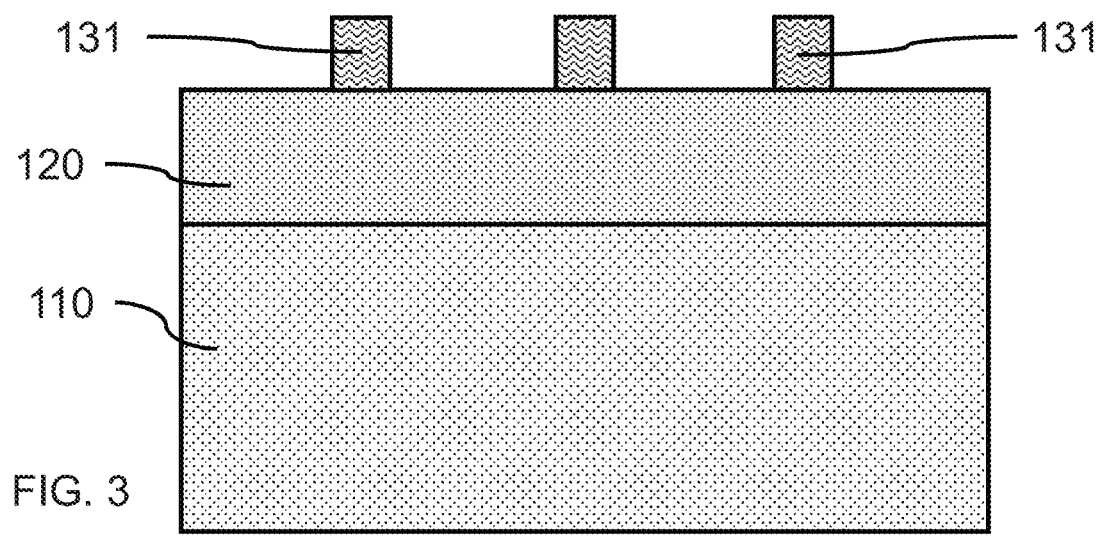
FIG. 3 is a cross-sectional side view of a photo mask layer patterned on the hardmask layer in accordance with an exemplary embodiment.

FIG. 3 is a cross-sectional side view of a photo mask layer patterned on the hardmask layer in accordance with an exemplary embodiment.

In one or more embodiments, the photo mask layer 130 may be patterned and developed to form photo mask blocks 131 covering at least a portion of the surface of the hardmask layer 120. Portions of the photo mask layer 130 may be removed to form the photo mask blocks 131 and expose underlying portions of the hardmask layer 120. The photo mask blocks may protect the covered portion of the hardmask layer 120, while exposed portions of the hardmask layer 120 may be etched to form hardmask fin templates on the substrate 110. One or more photo mask blocks 131 may define the width, length, and pitch of the one or more hardmask fin templates and thereby, the width, length, and pitch of the one or more vertical fins.

In one or more embodiments, the photo mask blocks 131 may have a width in the range of about 6 nm to about 20 nm, or may have a width in the range of about 8 nm to about 15 nm, or may have a width in the range of about 10 nm to about 12 nm. The photo mask blocks 131 may have a length in the range of about 100 nm to about 1000 nm, or in the range of about 100 nm to about 500 nm, or in the range of about 100 nm to about 400 nm, or in the range of about 100 nm to about 200 nm.

In various embodiments, there may be a pitch between adjacent photo mask blocks 131 in the range of about 30 nm to about 200 nm, or in the range of about 30 nm to about 100 nm, or in the range of about 30 nm to about 50 nm, or about 42 nm.

Figure 4:
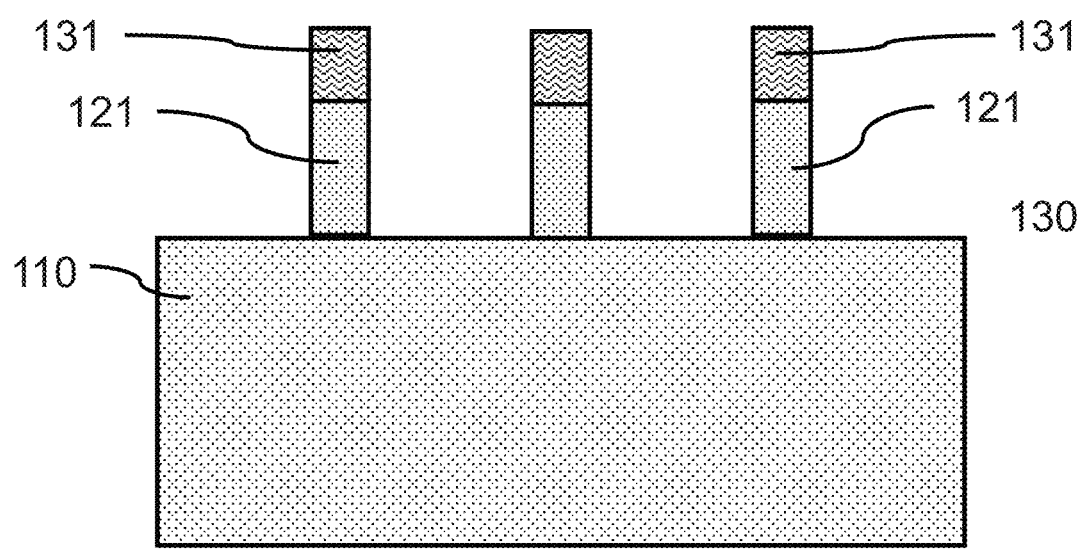
FIG. 4 is a cross-sectional side view of a hardmask fin template and photo mask block on the substrate in accordance with an exemplary embodiment.

FIG. 4 is a cross-sectional side view of a hardmask fin template and photo mask block on the substrate in accordance with an exemplary embodiment.

In one or more embodiments, the hardmask layer 120 may be etched to form one or more hardmask fin template(s) 121, where the photo mask blocks 131 defined the width, length, and location of the hardmask fin template(s) 121 on the substrate 110.

In various embodiments, the hardmask fin template(s) 121 may have a pitch in the range of about 30 nm to about 200 nm, or in the range of about 30 nm to about 100 nm, or in the range of about 30 nm to about 50 nm, or about 42 nm.

Figure 5:
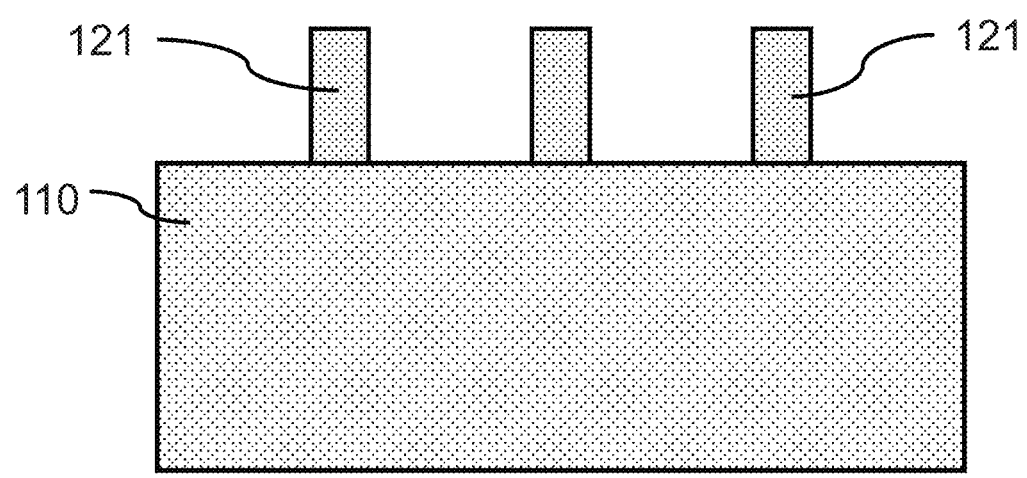
FIG. 5 is a cross-sectional side view of a hardmask fin template on the substrate in accordance with an exemplary embodiment.

FIG. 5 is a cross-sectional side view of a hardmask fin template on the substrate in accordance with an exemplary embodiment.

In one or more embodiments, the photo mask blocks 131 may be removed to expose the top surface(s) of the one or more hardmask fin template(s) 121. The photo mask blocks 131 may be removed by known stripping methods. In one or more embodiments, the hardmask fin template(s) 121 may have a width in the range of about 6 nm to about 20 nm, or may have a width in the range of about 8 nm to about 15 nm, or may have a width in the range of about 10 nm to about 12 nm.

Figure 6:
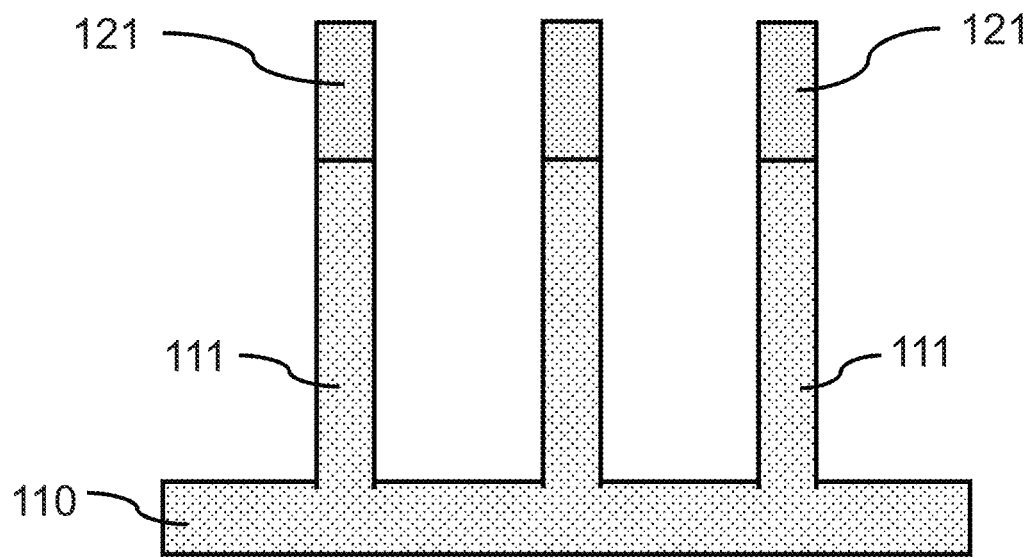
FIG. 6 is a cross-sectional side view of a hardmask fin template on a vertical fin on the substrate in accordance with an exemplary embodiment.

FIG. 6 is a cross-sectional side view of a hardmask fin template on a vertical fin on the substrate in accordance with an exemplary embodiment.

In one or more embodiments, a vertical fin 111 may be formed from the substrate 110 by etching the substrate between the hardmask fin template(s) 121. In various embodiments, the substrate may be etched using a dry plasma etch, where the substrate may be etched by reactive ion etching (RIE) to provide a directional etch with control of sidewall etching.

In various embodiments, a sidewall image transfer (SIT) technique may be used to form one or more vertical fins 111 on the substrate. In a typical SIT process, spacers are formed on the sidewall of a sacrificial mandrel. The sacrificial mandrel is removed and the remaining upright spacers are used as hardmask fin template(s) 121 to etch the top semiconductor layer and form one or more vertical fins 111. The upright spacers are then removed after the semiconductor vertical fins 111 have been formed. In various embodiments, the substrate may be a single crystal Si substrate and the vertical fins may be single crystal silicon.

The vertical fins 111 may be doped, and may form the channel of a vertical finFET, where the current flows in a vertical direction. A finFET device with a strained channel may have an increase drive current, and carrier (e.g., electron, hole) mobility.

In various embodiments, the fins 111 may have a width in the range of about 6 nm to about 20 nm, or may have a width in the range of about 8 nm to about 15 nm, or in the range of about 10 nm to about 12 nm.

In various embodiments, the fins may have a height in the range of about 25 nm to about 75 nm, or in the range of about 40 nm to about 50 nm.

In one or more embodiments, a doped region (i.e., source/drain region) (not shown) may be formed in the substrate 110. The doped region may be formed in-situ or ex-situ below the vertical fin(s) 111. The dopant may be provided to the doped region(s) (i.e., source/drain region(s)) by ion implantation, and source/drains formed by annealing the doped region(s). In various embodiments, the doped region may be n-doped or p-doped. The doped region may form a bottom source/drain. One or more doped regions may be formed in the substrate above which each of the one or more vertical fins may be formed, wherein the doped region forms a bottom source/drain for a vertical field effect transistor.

It should be noted that the source and drain can be interchanged between the top and bottom locations of a vertical fin, where the doped region in the substrate may act as a source or a drain.

In various embodiments, the materials and layers may be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions may be epitaxial processes, and the deposited material may be crystalline. In various embodiments, formation of a layer may be by one or more deposition processes, where, for example, a conformal layer may be formed by a first process (e.g., ALD, PE-ALD, etc.) and a fill may be formed by a second process (e.g., CVD, electrodeposition, PVD, etc.).

Figure 7:
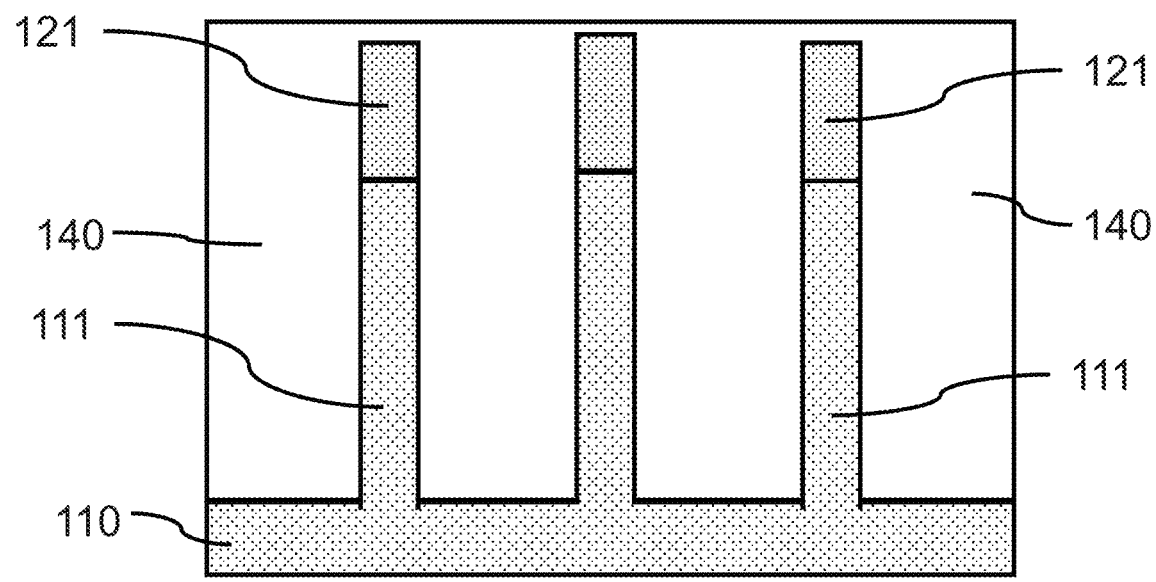
FIG. 7 is a cross-sectional side view of a sacrificial stressor layer over the hardmask fin template(s), and vertical fin(s) in accordance with an exemplary embodiment.

FIG. 7 is a cross-sectional side view of a sacrificial stressor layer over the hardmask fin template(s), and vertical fin(s) in accordance with an exemplary embodiment.

In one or more embodiments, a sacrificial stressor layer 140 may be formed on the exposed surface of the substrate 110. The sacrificial stressor layer 140 may be an oxide, for example, a flowable silicon oxide (SiO), a nitride, for example, a silicon nitride (SiN), or an oxynitride, for example, silicon oxynitride (SiON).

In one or more embodiments, sacrificial stressor layer 140 may be a film, such as silicon nitride (SiN) deposited on at least a portion of the exposed surface of substrate 110, where the SiN may create either a compressive or tensile stress depending on the deposition parameters and the hydrogen content of the SiN film. For example, in an exemplary embodiment, the hydrogen concentration of an SiN film may be adjusted to control the compressive or tensile stress generated by the SiN film due to film density. In various embodiments, the SiN film may be deposited by a plasma-enhanced CVD (PECVD) processes, where a dual frequency capacitively coupled chamber may be used to control the resulting tensile or compressive stresses. In various embodiments, the pressure of the reactants during formation may be adjusted to control the resulting tensile or compressive stresses of the deposited film, where higher pressures (e.g., >10 torr) may be used to generate a tensile stress, or lower pressures (e.g., 1-3 torr) may be used to generate compressive stresses. The hydrogen concentration may be controlled to effect the density and compressive stress of the deposited SiN film, where a compressively stressed film has a higher hydrogen concentration.

In various embodiments, a flowable oxide (FOX) may be applied to the substrate 110 by spin-coating followed by a thermal anneal to densify the FOX and form sacrificial stressor layer 140. In various embodiments, the flowable oxide may be Spin-on glass (SOG), where SOG can be a silicon oxide suspended in a solvent.

In various embodiments, a two stage oxide deposition process may be performed to deposit an oxide, which may be etched back by RIE, and another deposit of the oxide may be performed again to form sacrificial stressor layer 140. Flowable oxides, high aspect ratio processes (HARP), enhanced high aspect ratio processes (eHARP), and other techniques may be used to fill the area between the vertical fins 111.

In various embodiments, sacrificial stressor layer 140 may be an oxide deposited by atomic layer deposition (ALD) or low-pressure chemical vapor deposition (LPCVD). In an exemplary embodiment, the flowable oxide may be utilized as the sacrificial stressor layer 140. The FOX flows into the gaps between the vertical fins 111 to provide a uniform surface coverage.

In one or more embodiments, the sacrificial stressor layer 140 may be deposited over the substrate 110, vertical fin(s) 111, and hardmask fin template(s) 121 by a CVD process, where the sacrificial stressor material forming the sacrificial stressor layer 140 may be blanket deposited. The sacrificial stressor layer 140 may fill in the space between each of the vertical fins 111 and hardmask fin templates 121, and may be in contact with the sidewalls of the vertical fins 111 and hardmask fin templates 121. In various embodiments, the sacrificial stressor layer 140 may be in direct contact with the sidewalls of the vertical fins 111 and hardmask fin templates 121, where "direct contact" means that a first element, such as a first structure, and a second element, such as a second structure, are connected without any intermediary conducting, insulating or semiconductor layers at the interface of the two elements. The sacrificial stressor layer 140 may extend above the top surface of the hardmask fin template(s) 121.

In one or more embodiments, the sacrificial stressor layer 140 may be heat treated (e.g., annealed) to reduce the volume of the as-deposited sacrificial stressor material, where the reduction in volume may apply a compressive stress to the vertical fin(s) 111 in contact with the sacrificial stressor layer 140. In various embodiments, the sacrificial stressor layer 140 may be annealed at a temperature in the range of about 300° C. to about 700° C., although lower and higher temperature can be used to anneal and cure the as deposited sacrificial stressor layer 140.

In one or more embodiments, a sacrificial stressor layer 140 may contract less than an adjacent vertical fin 111 during cooling (due to differences in CTE) to apply a net tensile stress and impart a tensile strain in the vertical fin(s) 111 in contact with the sacrificial stressor layer 140. In various embodiments, the sacrificial stressor layer 140 may be exposed to a UV cure and/or undergo a high temperature anneal to increase tension and decrease compression, where the UV cure and/or high temperature anneal is sufficient to reduce the hydrogen concentration and/or generate additional Si—N bonds. High tensile stress values may be achieved at temperature of about 500° C. to about 700° C.

In various embodiments, the sacrificial stressor layer 140 may be chemically-mechanically polished (CMP) to reduce the height of the sacrificial stressor layer 140 to the top surface of the hardmask fin template(s) 121. The CMP may be continued to reduce the height of the sacrificial stressor layer 140 and the hardmask fin template(s) 121 to provide a uniform flat surface.

Figure 8:
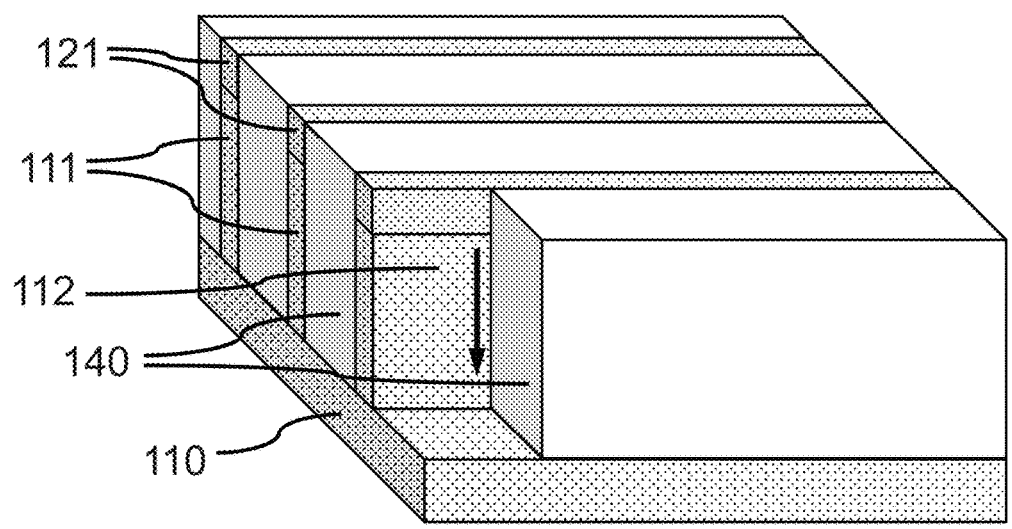
FIG. 8 is a perspective view of the cross-section of the sacrificial stressor layer on the sidewalls of hardmask fin template(s), and vertical fin(s) shown in FIG. 7 in accordance with an exemplary embodiment.

FIG. 8 is a perspective view of the cross-section of the sacrificial stressor layer on the sidewalls of hardmask fin template(s), and vertical fin(s) shown in FIG. 7 in accordance with an exemplary embodiment.

In one or more embodiments, the sacrificial stressor layer 140 fills the gaps between the vertical fins 111 and hardmask fin templates 121, where the sacrificial stressor layer 140 applies a compressive or tensile stress to at least the fin sidewalls 112 of one or more vertical fins 111. The sacrificial stressor layer 140 may pull the fin sidewall(s) 112 towards the surface of the substrate to impart a compressive strain from one or both sides of a vertical fins 111, or pull the fin sidewall(s) 112 upward from the substrate 110 to impart a tensile stress. The sacrificial stressor layer 140 may be strips in parallel with the vertical fins 111 and hardmask fin templates 121, where the sacrificial stressor layer 140 forms an alternating sequence of vertical fins 111 and sacrificial stressor layer 140 strips. In the various embodiments, the sacrificial stressor layer 140 may be in direct contact with the sidewalls 112 of the vertical fins 111 on each side of the sacrificial stressor layer 140.

In interpreting and understanding the present disclosure, it should be understood that the compressive and tensile stress is expressed in absolute values, where such nomenclature allows comparison of compressive stress values without reference to or possible confusion with the direction of the stress. For example, a compressive stress of 3.0 GPa is said to be greater than compressive stress of 2.0 GPa. Depending on the residual stress inside the sacrificial stressor materials applied, as well as the physical dimensions of the vertical fins, the stress applied to the vertical channel may be in a range of about 0.4 to about 2 GPa, or in the range of about 0.8 GPa to about 1.5 GPa, where the stress may be tensile or compressive, although stresses lower than 0.4 GPa or greater than 2 GPa may also be achieved and applied.

FIG. 8 also depicts a partially cut-away sacrificial stressor layer 140 on a fin sidewall 112, where the top surface of the hardmask fin templates 121 and sacrificial stressor layer 140 have been chemically-mechanically polished to a uniform height to provide a flat surface. A compressive strain is indicated by the downward arrow, where the compressive stress may be applied in the fin height direction along the length of the fin sidewall 112 in contact with the sacrificial stressor layer 140.

Figure 9:
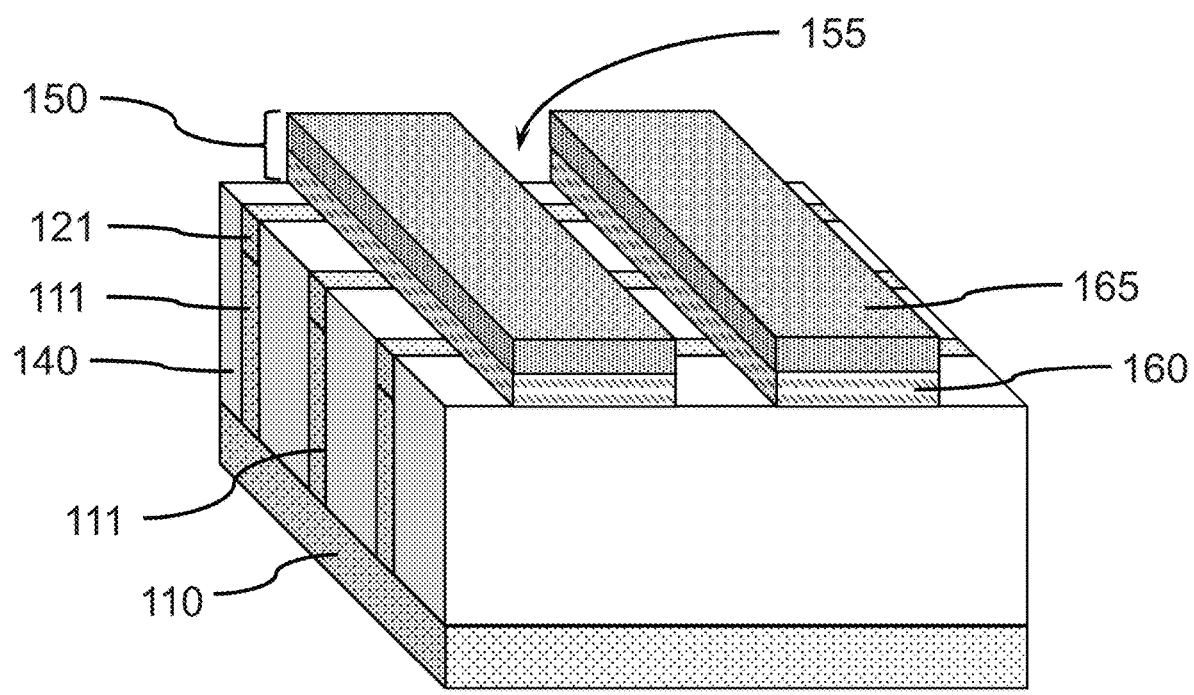
FIG. 9 is a perspective view of a cross-section of a fin-cut mask formed on the surface of the sacrificial stressor layer and the hardmask fin template(s) in accordance with an exemplary embodiment.

FIG. 9 is a perspective view of a cross-section of a fin-cut mask formed on the surface of the sacrificial stressor layer and the hardmask fin template(s) in accordance with an exemplary embodiment.

In one or more embodiments, a fin-cut mask may be formed on the top surface of the hardmask fin templates 121 and sacrificial stressor layer 140. In various embodiments, the fin-cut mask 150 may include two layers, where a first fin-cut mask layer may be a fin-cut hardmask 160, and the second fin-cut mask layer may be a fin-cut softmask 165.

In one or more embodiments, the fin-cut hardmask 160 may be a nitride, for example, silicon nitride (SiN), a silicon oxynitride (SiON), a silicon oxide (SiO), or a combination thereof. In various embodiments, the fin-cut softmask 165 may be a resist, for example, poly methyl methacrylate (PMMA), or polydimethylsiloxane (PDMS), as would be known in the art.

In various embodiments, the fin-cut mask 150 may be formed on the top surface of the hardmask fin templates 121 and sacrificial stressor layer 140 by forming a fin-cut hardmask 160 on at least a portion of the top surface of the hardmask fin templates 121 and sacrificial stressor layer 140, and forming a fin-cut softmask 165 on at least a portion of the fin-cut hardmask 160. The fin-cut softmask 165 may be patterned and developed to expose portions of the underlying fin-cut hardmask 160. The exposed portions of the fin-cut hardmask 160 may be removed to form a fin-cut mask trench 155 exposing at least portions of the hardmask fin templates 121 and sacrificial stressor layer 140. In various embodiments, the exposed portions of the hardmask fin templates 121 and sacrificial stressor layer 140 may be a bottom of the fin-cut mask trench 155 across the hardmask fin templates 121 and sacrificial stressor layer 140. The fin-cut mask trench 155 may be approximately perpendicular (e.g., ±5°, ±3°) to the long axis of the one or more vertical fins 111 and hardmask fin templates 121.

In various embodiments, the fin-cut hardmask 160 may be removed by a dry etch, for example, a reactive ion etch (RIE).

Figure 10:
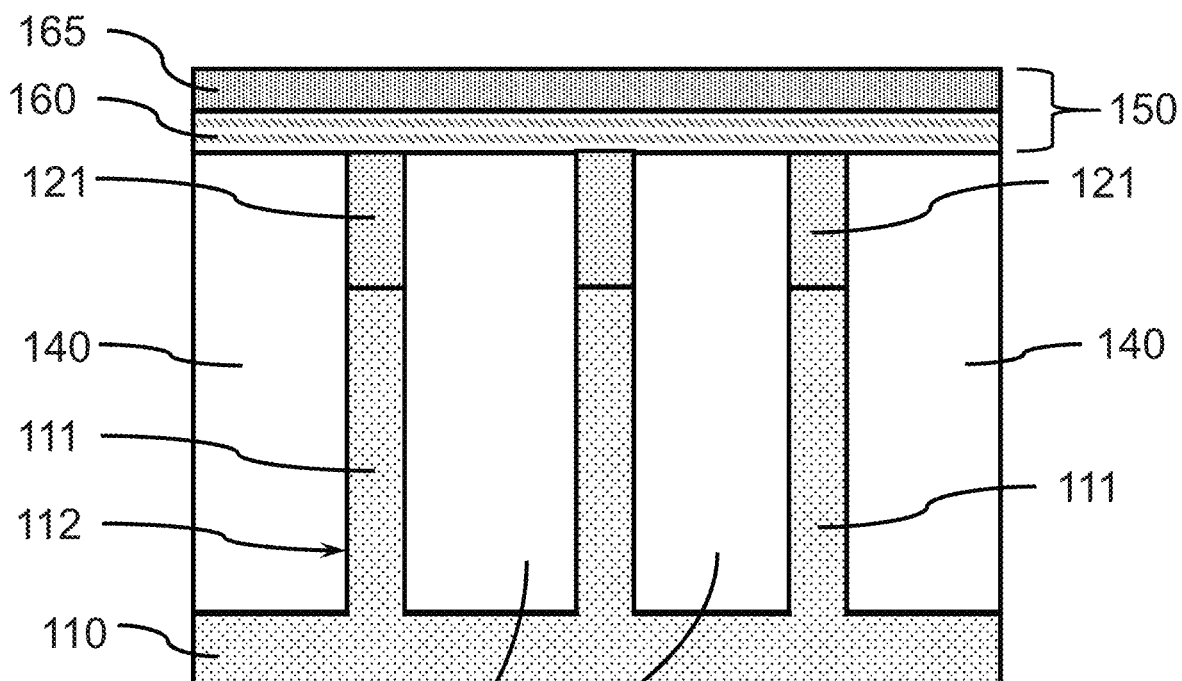
FIG. 10 is a cross-sectional side view of a fin-cut mask on a sacrificial stressor layer and hardmask fin template(s) in accordance with an exemplary embodiment.

FIG. 10 is a cross-sectional side view of a fin-cut mask on a sacrificial stressor layer and hardmask fin template(s) in accordance with an exemplary embodiment.

In one or more embodiments, the fin-cut mask 150 includes two or more layers, where the layers may be a fin-cut hardmask 160 on the sacrificial stressor layer 140, and a fin-cut softmask 165 on the fin-cut hardmask 160, over a plurality of vertical fins 111. The fin-cut hardmask 160 may protect portions of the sacrificial stressor layer 140 and hardmask fin templates 121 during a directional etching process (e.g., RIE), where the RIE is a form of plasma etching in which during the etching process, the surface to be etched is placed on a radio frequency (RF) powered electrode (e.g., electrostatic chuck/wafer pedestal). During RIE the surface to be etched may take on an electrical potential that accelerates the charged etching species extracted from plasma toward the surface, in which the chemical etching reaction takes place in a direction normal to the surface. Other examples of anisotropic etching that may be used at this point in the process include ion beam etching, plasma etching, or laser ablation.

In various embodiments, the sacrificial stressor layer 140 may apply a compressive stress to the fin sidewalls 112, and provide mechanical reinforcement and lateral support to the vertical fin(s) 111 during a directional etching (also referred to as a fin-cut) process. In various embodiments, the sacrificial stressor layer 140 may apply a tensile stress to the fin sidewalls 112, and provide mechanical reinforcement and lateral support to the vertical fin(s) 111 during a directional etching (also referred to as a fin-cut) process.

Figure 11:
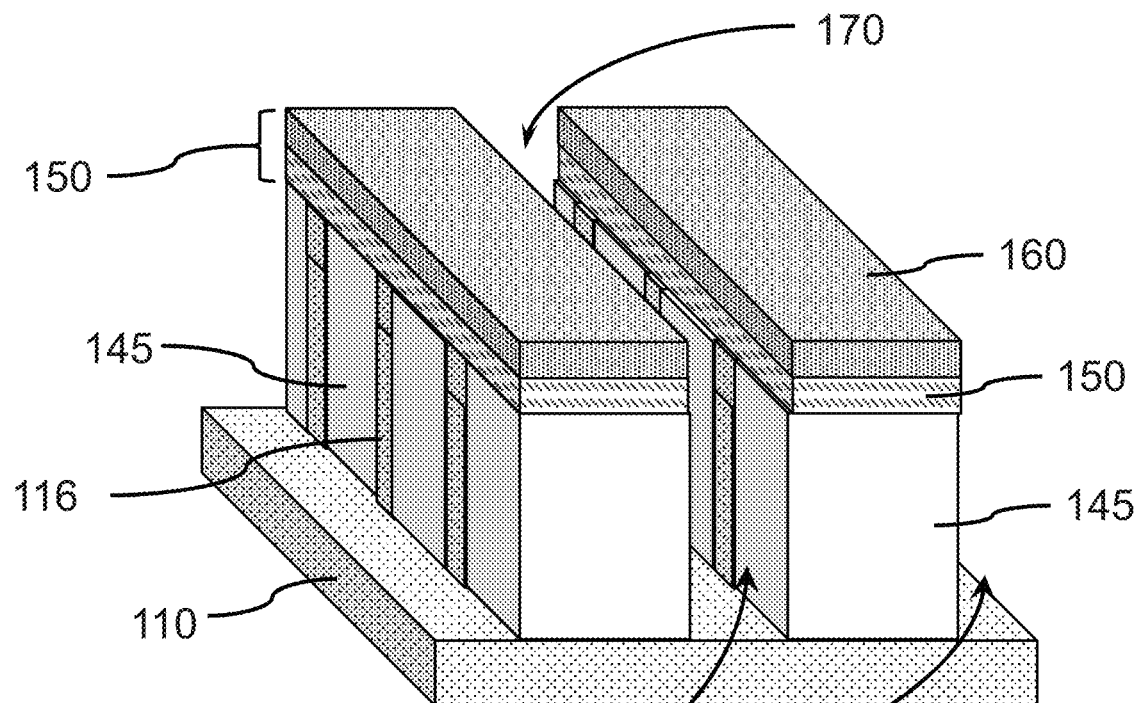
FIG. 11 is a perspective view of a cross-section of a fin trench through a fin-cut mask, vertical fins, hardmask fin templates, and sacrificial stressor layer in accordance with an exemplary embodiment.

FIG. 11 is a perspective view of a cross-section of a fin trench through a fin-cut mask, vertical fins, hardmask fin templates, and sacrificial stressor layer in accordance with an exemplary embodiment.

In one or more embodiments, a fin trench 170 may be formed in the sacrificial stressor layer 140, vertical fin(s) 111, and hardmask fin templates 121, where the fin trench 170 may be aligned with the fin-cut mask trench 155. The fin trench 170 may be formed by RIE, where the material exposed by the fin-cut mask trench 155 is removed. Portions of the sacrificial stressor layer 140, vertical fin(s) 111, and hardmask fin templates 121 may be removed down to or below the surface of the substrate 110 to form the fin trench 170. The fin trench 170 may separate the vertical fins into columns of fin segments 116 and a plurality of sacrificial stressor layer blocks 145 adjacent to two fin segments. In various embodiments, the fin trench may extend into the substrate 110 to form a shallow or deep trench isolation region to electrically separate devices formed by fins in the same column.

In various embodiments, the fin trench 170 may have a width in the range of about 30 nm to about 500 nm, or about 30 nm to about 100 nm, or about 100 nm to about 500 nm, although narrower and wider fin trenches 155 can also be formed. The fin segments 116 in the same row may be separated from fin segments in a neighboring row by a gap about the size of the fin trench 170.

Forming a fin trench 170 may separate vertical fin 111 into a series of shorter fin segments 116, where the fin segments 116 may be arranged in columns along the long axis of the vertical fin 111 and separated by the fin trench 170, and in rows separated by the sacrificial stressor layer blocks 145. Each sacrificial stressor layer block 145 may be in physical contact with the sidewalls 112 of two fin segments in neighboring columns.

In various embodiments, the sacrificial stressor layer 140 provides support to the thinner vertical fins 111 during formation of the one or more fin trench(s) 170, while maintaining a compressive or tensile stress on the fin sidewalls 112.

In various embodiments, the fin segments in a row may have a pitch in the range of about 30 nm to about 200 nm, or in the range of about 35 nm to about 100 nm, or in the range of about 40 nm to about 50 nm.

Figure 12:
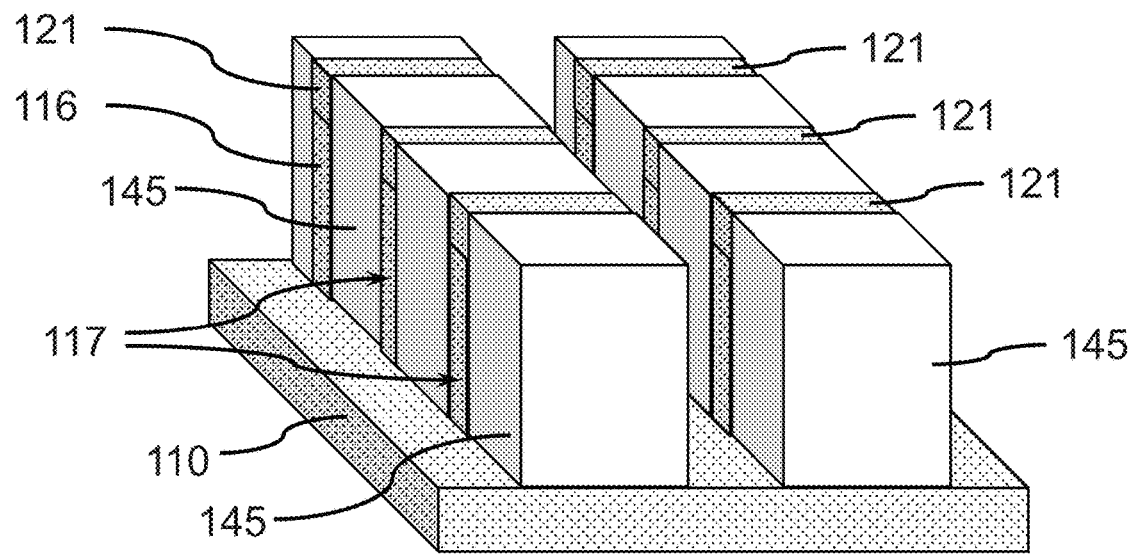
FIG. 12 is a perspective view of a cross-section of a fin trench through the vertical fins, hardmask fin templates, and sacrificial stressor layer after removal of the fin-cut mask in accordance with an exemplary embodiment.

FIG. 12 is a perspective view of a cross-section of a fin trench through the vertical fins, hardmask fin templates, and sacrificial stressor layer after removal of the fin-cut mask in accordance with an exemplary embodiment.

In one or more embodiments, the fin-cut mask 150 may be removed subsequent to the formation of the one or more fin trench(s) 170. The fin-cut softmask 165 may be removed without damaging or disrupting the exposed surfaces of the sacrificial stressor layer blocks 145 and fin segments 116 by processes known in the art (e.g., stripping, ashing). The fin-cut hardmask 160 may be removed by selective etching of the fin-cut hardmask material, where the sacrificial stressor layer and/or hardmask fin templates 121 may act as etch stops. The fin-cut hardmask material may be different from the material of the sacrificial stressor layer and/or hardmask fin templates 121. In various embodiments, the hardmask fin templates 121 may be an silicon oxynitride material (e.g., SiON), the fin-cut hardmask 160 may be silicon nitride (e.g., $Si_3N_4$), and the sacrificial stressor layer 140 may be silicon dioxide ($SiO_2$).

In various embodiments, the hardmask fin templates 121 may be exposed after removal of the fin-cut hardmask 160.

Figure 13:
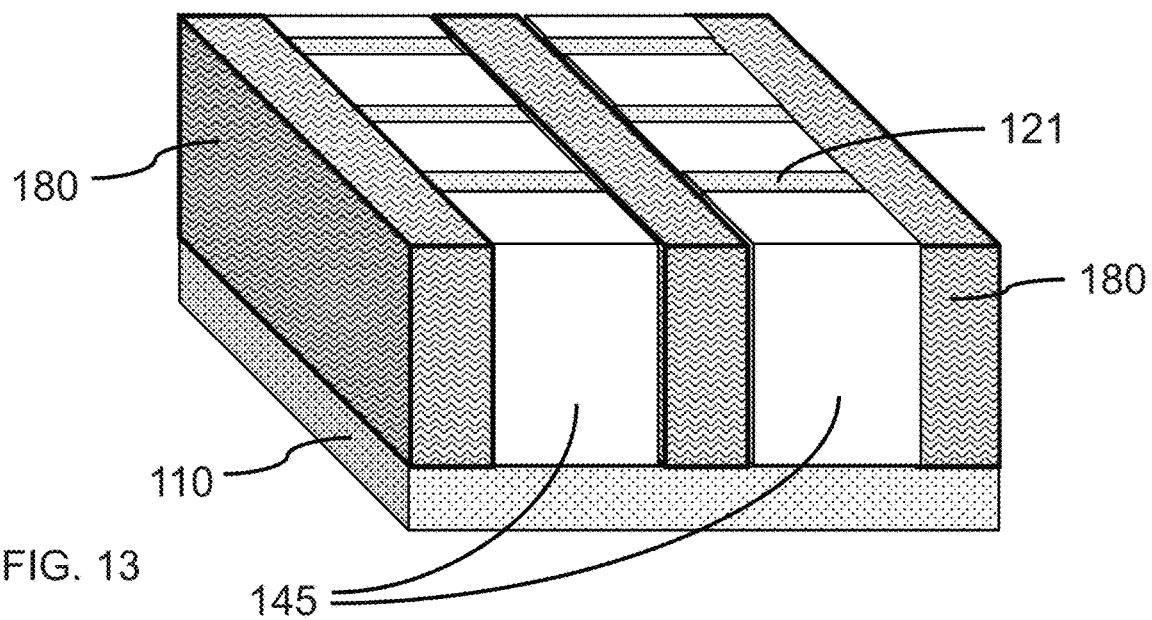
FIG. 13 is a perspective view of a cross-section of an anchor wall formed in the fin trenches adjacent to the vertical fins in accordance with an exemplary embodiment.

FIG. 13 is a perspective view of a cross-section of an anchor wall formed in the fin trenches adjacent to the vertical fins in accordance with an exemplary embodiment.

In one or more embodiments, an anchor wall 180 may be formed in one or more of the fin trench(s) 170. The anchor wall 180 may be formed adjacent to and in contact with one or more fin segment endwalls 117, where an anchor wall 180 may be on opposite ends of a fin segment 116. In various embodiments, the anchor walls 180 may be in a plane perpendicular to the long axis of the fin segments 116, and in contact with one or more fin segment endwalls 117 in the same row of fin segments 116.

In one or more embodiments, the anchor wall(s) 180 may be formed by a nitride material blanket deposited between the rows of fin segments 116, where an anchor wall may separate and be in contact with the endwalls 117 of two fin segments 116 in the same column The nitride may be a silicon nitride (SiN). In various embodiments, the nitride may be deposited by CVD, plasma-enhanced CVD, PVD or a combination thereof. The nitride may be deposited over the hardmask fin templates 121 and sacrificial stressor layer blocks 145, and a CMP performed to remove excess nitride material extending above the top surfaces of the hardmask fin templates 121 and sacrificial stressor layer blocks 145. In various embodiments, for example, the supporting anchor wall 180 may be composed of an oxide, such as silicon oxide (e.g., $SiO_2$), a nitride, such as silicon nitride (e.g., $Si_3N_4$), or a silicon oxynitride (e.g., $SiO_xN_y$). Because the anchor wall 180 is composed of a dielectric material, it may in some embodiments, be referred to as an isolation region. For example, the anchor wall 180 that is in contact with the endwall(s) 117 of the fin segment(s) 116 may form a deep trench isolation region between neighboring devices. In various embodiments, the anchor wall 180 may be a different material than the hardmask fin templates 121 to allow selective etching/removal.

While not intending to be bound by theory, it is believed that the anchor walls 180 may maintain the compressive strain of the fin segments 116 by securing the fin segments 116 in a reduced-height state created by the sacrificial stressor layer 140, where the anchor walls 180 secure the height of the fin segments 116 through contact with the fin segment endwalls 117. Similarly, it is believed that the anchor walls 180 may maintain the tensile strain of the fin segments 116 by securing the fin segments 116 in a fix-height state created by the sacrificial stressor layer 140, where the anchor walls 180 secure the height of the fin segments 116 through contact with the fin segment endwalls 117. The anchor walls 180 may prevent the relaxation mechanisms through which the compressive strain may be relieved from the vertical fin segments 116.

Figure 14:
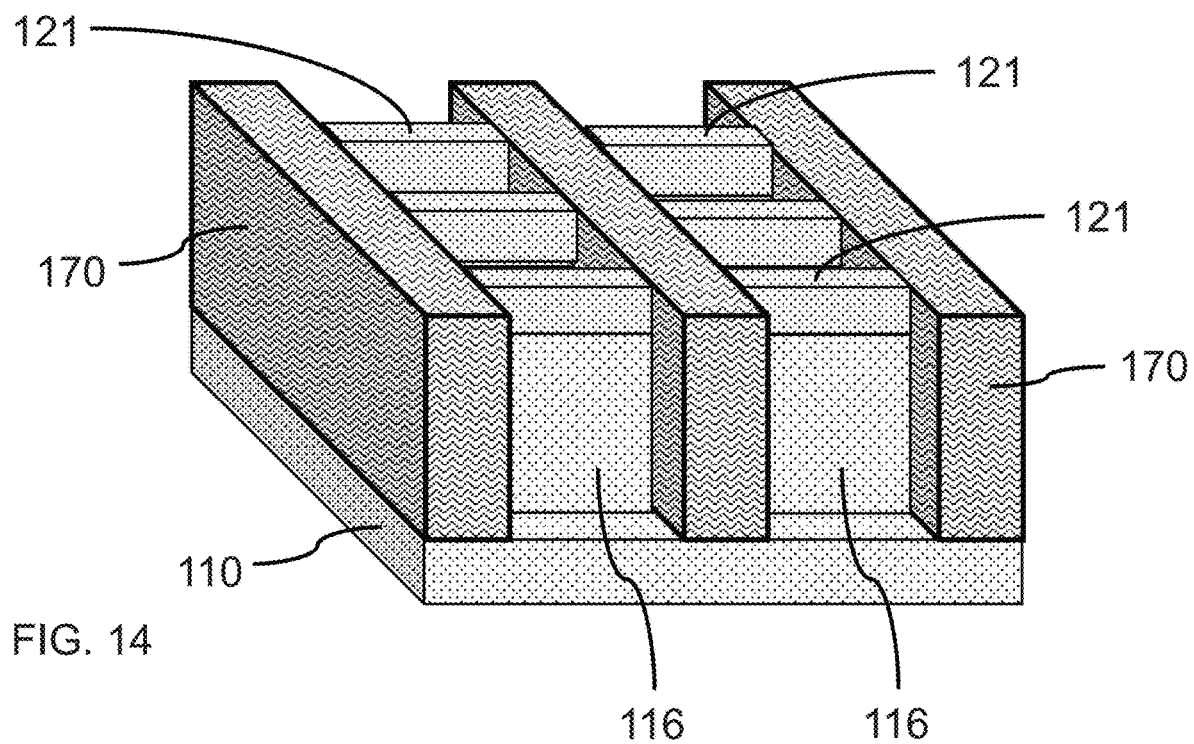
FIG. 14 is a perspective view of a cross-section of the anchor walls in contact with the fin segment endwalls, and exposed fin sidewalls after removal of sacrificial stressor layer blocks in accordance with an exemplary embodiment.

FIG. 14 is a perspective view of a cross-section of the anchor walls in contact with the fin segment endwalls, and exposed fin sidewalls after removal of sacrificial stressor layer blocks in accordance with an exemplary embodiment.

In one or more embodiments, the sacrificial stressor layer blocks 145 may be selectively removed to expose the fin sidewalls 112 and hardmask fin templates 121. The sacrificial stressor layer blocks 145 may be selectively removed by selective etching, where the etching may be a wet etch or a dry etch. In various embodiments, the etch process can be a dry etch such as, for example, chemical oxide removal, or a wet chemical etch which may employ an aqueous solution containing hydrofluoric acid (HF).

Figure 15:
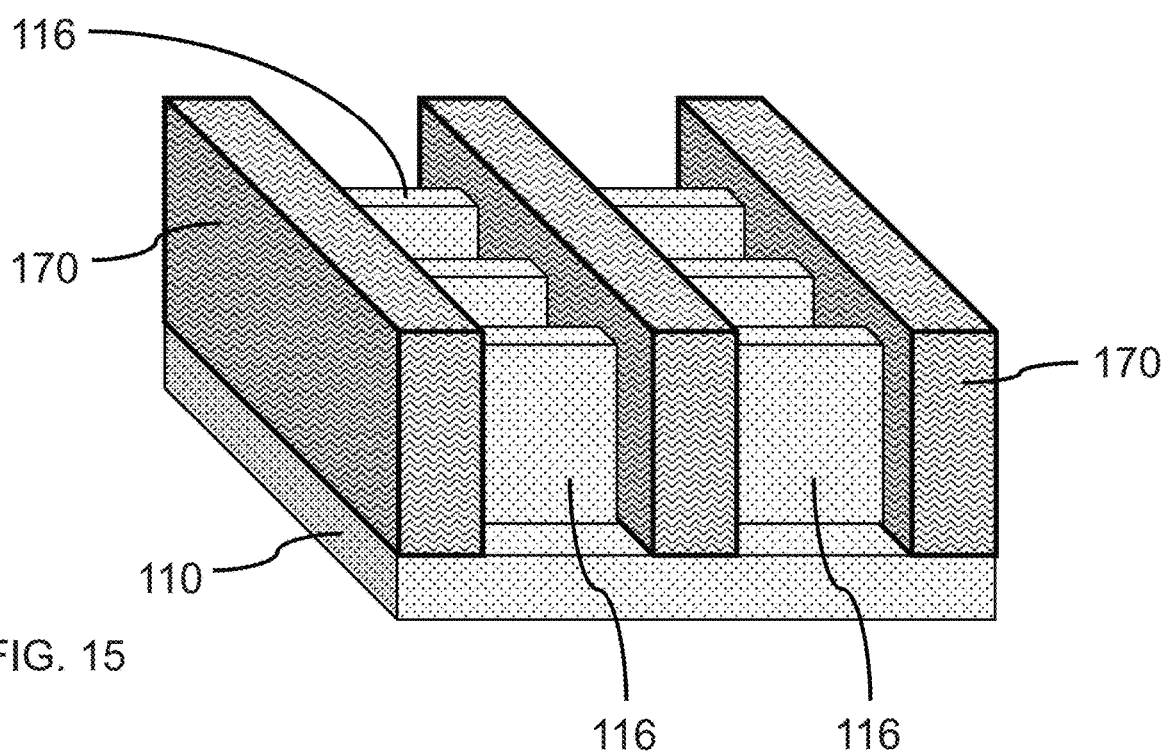
FIG. 15 is a perspective view of a cross-section of the anchor walls in contact with the fin segment endwalls, and the exposed fin sidewalls, after removal of the hardmask fin templates in accordance with an exemplary embodiment.

FIG. 15 is a perspective view of a cross-section of the anchor walls in contact with the fin segment endwalls, and the exposed fin sidewalls, after removal of the hardmask fin templates in accordance with an exemplary embodiment.

In one or more embodiments, the hardmask fin templates 121 may be selectively removed from the fin segments 116. The hardmask fin templates 121 may be selectively removed by a selective RIE to expose the top surface of the fin segments 116. In various embodiment, the hardmask fin templates 121 may be selectively removed prior to the removal of the sacrificial stressor layer blocks 145.

Figure 16:
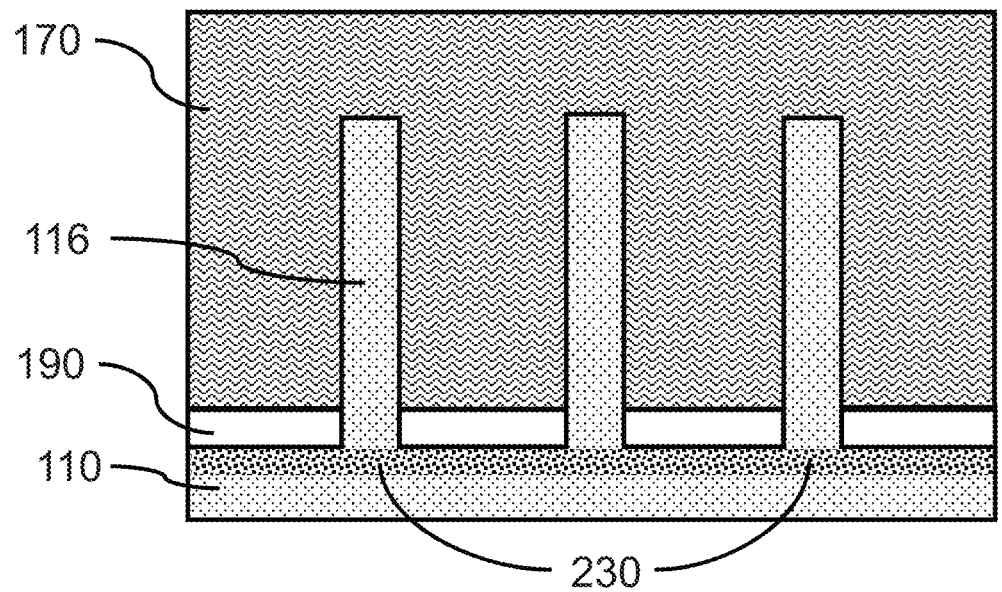
FIG. 16 is a cross-sectional side view of a doped region and a bottom spacer layer on the substrate between a plurality of fin segments in accordance with an exemplary embodiment.

FIG. 16 is a cross-sectional side view of a doped region and a bottom spacer layer on the substrate between a plurality of fin segments in accordance with an exemplary embodiment.

In one or more embodiments, a doped region 230, which may form a source/drain of a vertical finFET, may be formed in the substrate 110. The doped region 230 may be formed in-situ or ex-situ, below where the vertical fin(s) 111 may be formed. The dopant may be provided to the doped region(s) (i.e., source/drain region(s)) by ion implantation, and source/drains formed by annealing the doped region(s) 230. In various embodiments, the doped region 230 may be n-doped or p-doped. The doped region 230 may form a bottom source/drain. One or more doped regions 230 may be formed in the substrate above which each of the one or more fin segments 116 may be formed, wherein the doped region 230 forms a bottom source/drain for a vertical field effect transistor. It should be noted that the source and drain can be interchangeable between the top and bottom locations of a fin segment forming the channel of a vertical field effect transistor, where the doped region 230 in the substrate 110 may act as a source or a drain for one or more of the fin segments 116, such that the doped region 230 can form a common source/drain for one or more fin segments 116.

In one or more embodiments, a bottom spacer layer 190 may be formed on at least a portion of the exposed surface of the substrate 110 between the fin segments 116. The bottom spacer layer 190 may cover the substrate between the rows of fin segments 116, and may cover a portion of the sidewalls of the fin segments. The front anchor wall 180 is outside the plane of the cross-sectional view, so not shown in FIG. 16, however, the back anchor wall 180 is depicted behind the vertical fin segments 116.

In various embodiments, the bottom spacer layer 190 may be formed by high density plasma (HDP) CVD, PVD, or a combination thereof, where the bottom spacer layer 190 may be blanket deposited on the vertical fin segments 116 and the surface of the substrate 110. Formation of a bottom spacer 190 may involve a directional, non-conformal deposition to provide a thicker layer of a dielectric material on surfaces normal to the direction of the deposition than on the sidewalls along the direction of the deposition. The spacer material on fin segment sidewalls may be removed by a suitable wet etch process, such as BHF (buffered hydrofluoric) etch or SICONI™ etch (involving exposure of a substrate to $H_2$, $NF_3$ and $NH_3$ plasma by-products). In various embodiments, the bottom spacer layer 190 may be deposited by a directional PVD on the surface of the substrate 110. The bottom spacer layer 190 may be silicon nitride (SiN), silicon oxide (SiO), silicon oxynitride (SiON), a multi-layer arrangement of silicon oxide and silicon nitride, or combinations thereof.

Figure 17:
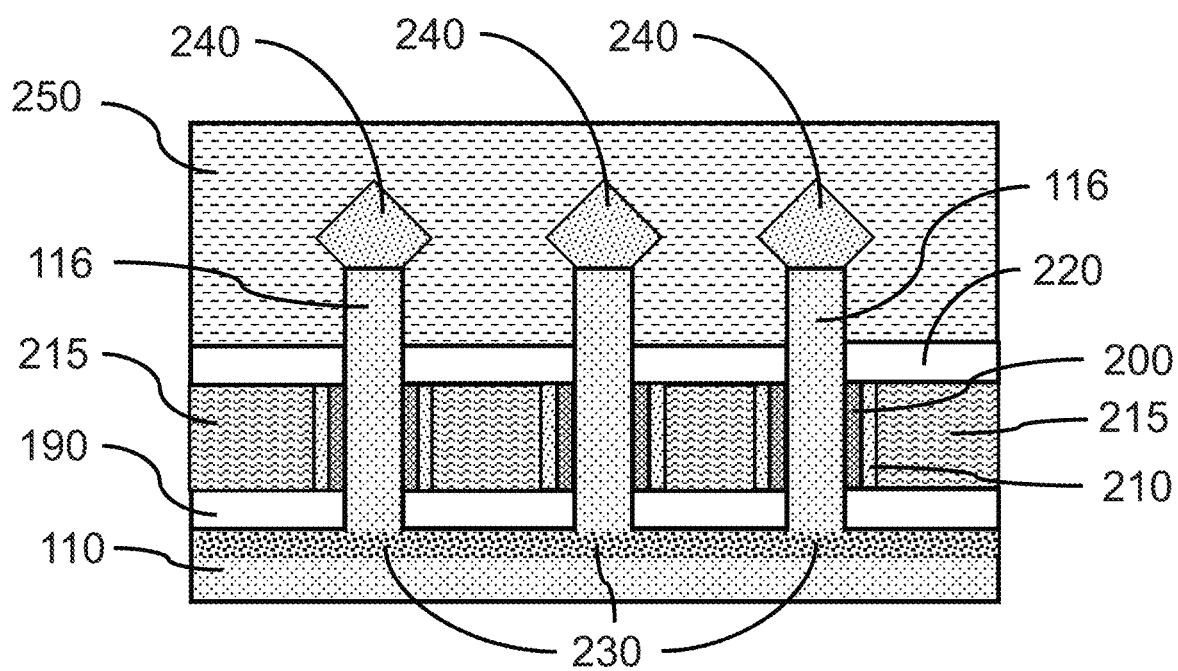
FIG. 17 is a cross-sectional side view of a gate structure and top source/drains formed on the plurality of fin segments in accordance with an exemplary embodiment.

FIG. 17 is a cross-sectional side view of a gate structure and top source/drains formed on the plurality of fin segments in accordance with an exemplary embodiment.

In one or more embodiments, a gate structure may be formed on the fin segments 116 by depositing a gate dielectric layer 200 on at least a portion of the exposed sidewall of the fin segments, where the gate dielectric layer 200 may also be formed on at least a portion of the bottom spacer layer 190. Undesired portions of the gate dielectric layer 200 may be removed from at least a portion of the bottom spacer layer 190 to form at least a portion of the gate structure on the fin segments 116.

In various embodiments, the gate dielectric layer 200 may be a high-K dielectric material that may include, but is not limited to, metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., PbZn$_{1/3}$ Nb$_{2/3}$ O$_3$). The high-k material may further include dopants such as lanthanum and/or aluminum. The stoichiometry of the high-K compounds may vary.

In various embodiments, the gate dielectric layer 200 may have a thickness in the range of about 1.5 nm to about 2.5 nm.

In various embodiments, a work function layer 210 may be formed on the fin segments 116 by depositing a work function layer 210 on at least a portion of the exposed sidewall of the fin segments, where the work function layer 210 may also be formed on at least a portion of the bottom spacer layer 190 and/or gate dielectric layer 200. Undesired portions of the work function layer 210 may be removed from at least a portion of the bottom spacer layer 190 and/or gate dielectric layer 200 to form at least a portion of the gate structure on the fin segments 116.

In one or more embodiments, a work function layer 210 may be deposited over the gate dielectric layer 200. The work function layer 210 may form part of a gate structure, where the gate structure may be on a vertical fin segment 116.

In various embodiments, the work function layer 210 may be a nitride, including but not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC), tantalum carbide (TaC), hafnium carbide (HfC), and combinations thereof.

In various embodiments, the work function layer 210 may have a thickness in the range of about 3 nm to about 11 nm, or may have a thickness in the range of about 5 nm to about 8 nm.

In one or more embodiments, a gate metal layer 215 may be formed on the work function layer 210, where the gate metal layer 215 may be a layer conformally deposited on the work function layer 210. In various embodiments, the gate metal layer 215 may be tungsten (W), cobalt (Co), or a combination thereof. The gate metal layer 215 may form part of a gate structure, where the gate structure may be on a vertical fin segment 116.

The portions of the gate metal layer 215 and work function layer 210 on top of the fin segment(s) 116 may be removed by RIE or a suitable wet etch process. In various embodiments, the gate structure may wrap around three sides or four sides of the vertical fin. The gate metal layer 215 may be a gate electrode for a vertical finFET.

In various embodiments, when gate stacks on the vertical fin sidewalls 112 are recessed from the top edge of the fin segment 116 to a reduced height, a top spacer layer 220 may be formed on the top surface of the gate structure, where the top spacer layer 220 may be between the fin segments 116.

In one or more embodiments, a top spacer layer 220 may be formed on at least a portion of the gate metal 215, work function layer 210, and/or gate dielectric layer 200. The top spacer 220 may be on the gate structure opposite the bottom spacer 190. The top spacer layer 220 may be in contact with a portion of the fin segments 116. In various embodiments, the top spacer layer 220 may be a dielectric layer, where the top spacer layer 230 may be a low-K dielectric material layer. The top spacer layer 220 may electrically isolate the gate structure from a top source/drain. The material and deposition method can be same as that was used for bottom spacer formation. The excess top spacer material on the sidewalls of the exposed vertical fins can be removed by directional RIE etch process.

In one or more embodiments, a doped material forming a top source/drain 240 may be formed on the one or more vertical fin segments 116. The top source/drain 240 may be formed by epitaxial growth on the exposed top portions of the fin segments 116, such that the fin segments 116 and the top source/drain 240 have the same crystal orientation. The top source/drain may be n-doped or p-doped, and the doping may be in-situ or ex-situ. The top source/drain 240 may have the same doping type as the bottom source/drain 230, and form an n-type or p-type vertical finFET with the vertical channel.

In various embodiments, the locations of the source and drain of a vertical transistor may be reversed such that the drain is on the top of a vertical fin, while the source is at the bottom. The source may, therefore, be at the bottom or the top.

In one or more embodiments, a gate contact may be deposited on the gate metal layer 215. The gate contact may provide an electrical contact with the gate metal layer 215 to connect the gate structure to an electrical line (e.g., word line, signal line, etc.).

In one or more embodiments, an interlayer dielectric (ILD) layer 250 may be formed between the anchor walls 180 on opposite ends of the fin segments 116. The ILD may be an insulating dielectric material, which may be a low-K dielectric material, for example, porous silicon dioxide, carbon-doped silicon dioxide, or fluorine doped silicon dioxide.

FIG. 17 also shows a cross-sectional side view of a vertical fin field effect transistor having a strained channel, a gate structure with a gate electrode, and source/drain region on the vertical fin in accordance with another exemplary embodiment.

In one or more embodiments, one or more vertical fins 111 or fin segments 116 may be removed as dummy fins to increase the distance between two neighboring fins/segments to create an arrangement of fins/segments that may form one or more separate devices, for example, complementary metal-oxide semiconductor devices. The devices may be multi-fin devices, where two or more fins may share a common doped region 230 in the substrate 110 and have electrically coupled top source/drains 240 and/or electrically coupled gate structures.

Having described preferred embodiments for the fabrication of vertical field effect transistor structure with strained channels (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a vertical finFET with a strained channel, comprising:
   forming a vertical fin on a substrate;
   forming a doped region in the substrate below the vertical fin;
   forming a sacrificial stressor layer on each sidewall of the vertical fin, wherein the sacrificial stressor layer is in contact with the sidewalls of the vertical fin, and imparts a vertical tensile or vertical compressive strain to the vertical fin; and forming an anchor wall at each end of the vertical fin, where the anchor wall is in contact with the endwall of the vertical fin, and where the anchor wall maintains the vertical fin in a strained state.

2. The method of claim 1, wherein the width of the vertical fin is in the range of about 6 nm to about 20 nm.

3. The method of claim 1, wherein the anchor wall at each end of the vertical fin is silicon nitride or silicon oxynitride.

4. The method of claim 1, further comprising heat treating the sacrificial stressor layers to reduce the volume of the sacrificial stressor layer.

5. The method of claim 1, further comprising forming a fin trench through the vertical fin and the sacrificial stressor layer on each sidewall of the vertical fin to form the endwalls of a plurality of fin segments and a plurality of sacrificial stressor layer blocks adjacent to each sidewall of the plurality of fin segments, and forming an anchor wall in the fin trench.

6. The method of claim 5, wherein the vertical compressive strain induced in the plurality of fin segments is in the range of about 0.4 GPa to about 2 GPa, and the width of the fin trench is in the range of about 30 nm to about 500 nm.

7. A method of forming a vertical finFET with a strained channel, comprising:
forming a vertical fin on a substrate, wherein the width of the vertical fin is in the range of about 6 nm to about 20 nm;
forming a doped region in the substrate below the vertical fin;
forming a sacrificial stressor layer on each sidewall of the vertical fin, wherein the sacrificial stressor layer is in contact with the sidewalls of the vertical fin, and imparts a vertical tensile or vertical compressive strain to the vertical fin; and
forming an anchor wall at each end of the vertical fin, where the anchor wall is in contact with the endwall of the vertical fin, and where the anchor wall maintains the vertical fin in a strained state, wherein the anchor wall at each end of the vertical fin is silicon nitride or silicon oxynitride.

8. The method of claim 7, further comprising heat treating the sacrificial stressor layers to reduce the volume of the sacrificial stressor layer.

9. The method of claim 7, further comprising forming a fin trench through the vertical fin and the sacrificial stressor layer on each sidewall of the vertical fin to form the endwalls of a plurality of fin segments and a plurality of sacrificial stressor layer blocks adjacent to each sidewall of the plurality of fin segments, and forming an anchor wall in the fin trench.

10. The method of claim 9, wherein the vertical compressive strain induced in the plurality of fin segments is in the range of about 0.4 GPa to about 2 GPa, and the width of the fin trench is in the range of about 30 nm to about 500 nm.

11. A method of forming a vertical finFET with a strained channel, comprising:
forming a vertical fin on a substrate;
forming a doped region in the substrate below the vertical fin;
forming a sacrificial stressor layer on each sidewall of the vertical fin, wherein the sacrificial stressor layer is in contact with the sidewalls of the vertical fin, and imparts a vertical tensile or vertical compressive strain to the vertical fin, wherein the sacrificial stressor layer is selected from the group consisting of a flowable silicon oxide (SiO), silicon nitride (SiN), or silicon oxynitride (SiON);
forming an anchor wall at each end of the vertical fin, where the anchor wall is in contact with the endwall of the vertical fin, and where the anchor wall maintains the vertical fin in a strained state; and
heat treating the sacrificial stressor layers to reduce the volume of the sacrificial stressor layer.

12. The method of claim 11, wherein the width of the vertical fin is in the range of about 6 nm to about 20 nm.

13. The method of claim 11, wherein the anchor wall at each end of the vertical fin is silicon nitride or silicon oxynitride.

14. The method of claim 11, further comprising forming a fin trench through the vertical fin and the sacrificial stressor layer on each sidewall of the vertical fin to form the endwalls of a plurality of fin segments and a plurality of sacrificial stressor layer blocks adjacent to each sidewall of the plurality of fin segments, and forming an anchor wall in the fin trench.

15. The method of claim 14, wherein the vertical compressive strain induced in the plurality of fin segments is in the range of about 0.4 GPa to about 2 GPa, and the width of the fin trench is in the range of about 30 nm to about 500 nm.

16. The method of claim 14, wherein the fins have a height in the range of about 25 nm to about 75 nm.

17. The method of claim 14, further comprising selectively removing the sacrificial stressor layer blocks to expose the fin segment sidewalls.

18. The method of claim 17, further comprising forming a bottom spacer layer on at least a portion of the substrate between the fin segments exposed by removing the sacrificial stressor layer blocks.

19. The method of claim 18, further comprising forming a gate structure on at least a portion of the fin segments.

20. The method of claim 19, further comprising forming a top source/drain on each of the fin segments.

* * * * *